United States Patent [19]

Weigert et al.

[11] Patent Number: 5,112,468
[45] Date of Patent: May 12, 1992

[54] TARGET FOR MAGNETRON-SPUTTERING SYSTEMS

[75] Inventors: Martin Weigert, Hanau; Lorenz Berchtold, Neurmberg; Stephan U. Schittny, Alzenau-Kaelberau, all of Fed. Rep. of Germany

[73] Assignee: Degussa AG, Frankfurt am Main, Fed. Rep. of Germany

[21] Appl. No.: 651,050

[22] Filed: Feb. 4, 1991

Related U.S. Application Data

[63] Continuation of Ser. No. 360,482, Jun. 2, 1989, abandoned.

[30] Foreign Application Priority Data

Jun. 11, 1988 [DE] Fed. Rep. of Germany ....... 3819906

[51] Int. Cl.$^5$ .............................................. C23C 14/34
[52] U.S. Cl. ................................ 204/298.13; 420/436
[58] Field of Search ................... 204/298.13; 420/435, 420/436

[56] References Cited

U.S. PATENT DOCUMENTS

2,981,620  4/1961  Brown et al. ...................... 420/436
4,832,810  5/1989  Nakamura et al. ............. 204/192.15

FOREIGN PATENT DOCUMENTS

96061   8/1981  Japan .
966376  8/1964  United Kingdom .

Primary Examiner—Nam Nguyen
Attorney, Agent, or Firm—Beveridge, DeGrandi & Weilacher

[57] ABSTRACT

Targets for magnetron - sputtering systems with a high utilization of material are obtained from ferromagnetic alloys if the amount of hexagonal structural phase is greater than the cubic phase portion and if the hexagonal prism axis (0001) is aligned preferably vertically to the target surface.

7 Claims, No Drawings

TARGET FOR MAGNETRON-SPUTTERING SYSTEMS

CROSS REFERENCE TO RELATED APPLICATIONS

This application is a continuation of U.S. patent application Ser. No. 07/360,482, filed Jun. 2, 1989, now abandoned.

INTRODUCTION AND BACKGROUND

The present invention relates to a target for magnetron - sputtering systems consisting of a ferromagnetic alloy whose phase diagram exhibits a cubic and a hexagonal phase, whereby the hexagonal phase is present at the operating temperature of the target in a state of equilibrium but large portions of cubic structural components can still be present due to kinetic obstructions.

Permanent magnets are arranged behind the target (cathode) in magnetron - sputtering for optimizing the atomization process. This is carried out so that a magnetic field forms in front of the target in the discharge space. In this way, the field functions so that the discharge plasma is localized. The area of the target surface over which the plasma is localized is preferably sputtered, which forms an erosion trench at that location.

Basically, two problems occur thereby in ferromagnetic targets:

First, the magnetic flux of the permanent magnets is bundled in the target so that only a low flux can exit into the discharge space. This problem therefore requires the use of very thin ferromagnetic targets.

Second, the local cross-sectional decrease of the target during the sputtering (erosion trench) brings about an increasing magnetic flux directly over the erosion trench in the case of ferromagnetic targets. This causes a higher ionization probability of the sputtering gas to occur locally and a higher sputtering rate to occur locally, with the consequence that the erosion trench becomes very narrow, coupled with only a slight material yield of the target.

Improved magnetic field geometries and a higher magnetic field in the discharge space can be achieved by expensive target designs. Slots in the target vertical to the direction of the magnetic field can raise the magnetic resistance in the target and bring about a larger field in the discharge space (K. Nakamura et al. IEEE Transactions on Magnetics 18 (1982), p. 1080).

Kukla et al. (IEEE Transactions on Magnetics 23 (1987), p. 137) describe a cathode for ferromagnetic materials which consists of several individual targets arranged in two planes over each other in order to achieve a higher magnetron magnetic field. However, these designs are expensive and make the magnetron - sputtering more difficult.

SUMMARY OF THE INVENTION

It is an object of the present invention to provide a target for magnetron - sputtering systems formed of a ferromagnetic alloy whose phase diagram exhibits a cubic and a hexagonal phase, whereby the hexagonal phase is present during magnetron sputtering operation of the target in a state of equilibrium; large portions of cubic phase structural components can still be present due to kinetic obstructions. A greater thickness and a higher utilization of material should be able to be achieved in this target without expensive design measures.

A feature of the invention resides in the fact that the amount of hexagonal phase is greater than the amount of cubic phase and that the hexagonal phase is aligned with the hexagonal prism axes (0001) mostly vertical to the target surface.

It is preferable to use targets in which the X-ray backscatter intensity of the hexagonal (0001) Bragg reflex, measured with Mo-K$\alpha$ radiation, vertical to the target plane is greater by more than a factor of 1.5 than the average X-ray intensity, averaged over the entire half space over the target plane. Especially good targets are obtained if the X-ray backscatter intensity of the (0001) reflex is greater than the average X-ray intensity by at least a factor of 2.5.

It is preferable to use alloys with more than 60% by weight cobalt for these targets.

The advantageous properties of these targets can be achieved if a higher amount of hexagonal phase is set in the corresponding alloys than can be achieved by means of constantly cooling off from an annealing temperature above the phase conversion temperature, in as far as the target material is not already completely hexagonal at room temperature. In addition, a preferred orientation must be imparted to the hexagonal phase portion in such a manner that the hexagonal prism axes are preferably vertical to the target surface (000 1 -fiber texture).

It was surprisingly found that even a slight (000 1)-fiber texture results in considerably better magnetic qualities of the target relative to the field line curve during magnetron sputtering. In order to characterize the magnetic target qualities, the magnetic field components were measured parallel to the target surface which components are obtained on a typical sputtering cathode with permanent magnets (field strength directly above the magnet: 240 KA/m).

DETAILED EMBODIMENT OF THE INVENTION

The table shows the magnetic field strengths which are measured directly above the target surface in the middle between the two permanent magnets for hexagonal or partially hexagonal target materials. The table also indicates the width of the range in which the field strength decreases by 10% from the maximum value. It turns out that the material states which have received a higher hexagonal structural portion as a result of a cold deformation and whose hexagonal prism axes were aligned mostly vertically to the target surface exhibit a higher maximum field strength in front of the target as well as a wider homogeneous magnetic field range in front of the target.

The higher magnetic field in the discharge space permits the use of thicker targets, especially since the relative increase of the magnetic field of the magnetron becomes larger as the thickness increases. The wider homogeneous magnetic field range in the anisotropic state results in a wider initial erosion trench, so that a greater utilization of the target material is achieved during the atomizing process.

Alloys 1 and 3 still exhibit a high cubic phase portion of approximately 50% and are not aligned, whereas in alloys 2 and 4 the hexagonal phase portion was raised by a cold deformation and at the same time an alignment of the hexagonal prism axes was undertaken. Alloys 5 and 7 do exhibit a hexagonal structure but no alignment, whereas in alloys 6 and 8 an alignment of the hexagonal prism axes was undertaken by a cold deformation, which is expressed in the higher values of the X-ray backscatter intensity of the hexagonal (0001) reflex.

The manufacture of the target took place by means of melting the alloy in an electron-beam furnace, forging the cast ingot at 800° to 1200° C. and hot rolling at 800° to 1200° C. The targets of alloys 1,3,5 and 7 were subsequently annealed one-half hour at 1200° C. and allowed to slowly cool down, whereas the targets of alloys 2,4,6 and 8 were quenched in water and subsequently cold-deformed below 400° C.

TABLE

| No. | Composition (at %) | | | Thickness (mm) | Degree of Cold Deformation % | Hexagonal Portion (%) | Relative X-ray backscatter intensity (000-1) reflex | $H_{max}$ (kA/m) | 10% decrease (mm) |
| --- | --- | --- | --- | --- | --- | --- | --- | --- | --- |
| | Co | Ni | Cr | | | | | | |
| 1 | 62.5 | 30 | 7.5 | 2 | 0 | 50 | 1.0 | 36 | 51 |
| 2 | 62.5 | 30 | 7.5 | 2 | 50% | 80 | ca. 1.9 | 48 | 72 |
| 3 | 62.5 | 30 | 7.5 | 4 | 0 | 50 | 1.0 | 10 | 49 |
| 4 | 62.5 | 30 | 7.5 | 4 | 50% | 80 | ca. 1.9 | 38 | 67 |
| 5 | 74 | 18 | 8 | 2.5 | 0 | ca. 100 | 1.2 | 38 | 56 |
| 6 | 74 | 18 | 8 | 2.5 | 50% | 100 | 2.5 | 46 | 71 |
| 7 | 80 | 20 | 0 | 2.5 | 0 | ca. 100 | 1.1 | 32 | 55 |
| 8 | 80 | 20 | 0 | 2.5 | 50% | 100 | 2.7 | 40 | 74 |

It can be seen from the above table that the alloys expressed in atomic % contain:

```
62.5-80% Co
18-30% Ni
0-8% Cr.
```

Further variations and modifications of the invention will be apparent to those skilled in the art from the foregoing description and are intended to be encompassed by the appended claims.

German priority application P 38 19 906.8 is relied on and incorporated by reference.

We claim:

1. A target obtained by forming a ferromagnetic alloy into a magnetron sputter target for magnetron - sputtering systems comprising a ferromagnetic alloy whose phase diagram exhibits a cubic and a hexagonal phase, whereby during magnetron sputtering operation of the target the hexagonal phase is present in a state of equilibrium with portions of cubic phase, wherein the amount of hexagonal phase is greater than the amount of cubic phase and the hexagonal phase is aligned with the hexagonal prism axes (0001) mostly vertical to the target surface, wherein the X-ray backscatter intensity of the hexagonal (0001) Bragg reflex, measured with Mo-K$\alpha$ radiation, vertical to the target plane is greater by more than a factor 1.5 than the average X-ray intensity, averaged over the entire half space over the target plane.

2. The target according to claim 1 wherein the X-ray backscatter intensity of the (0001) reflex is greater than the average X-ray intensity by at least a factor of 2.5.

3. The target according to claim 1 consisting of a cobalt alloy.

4. The target according to claim 3 wherein the cobalt alloy has more than 60% by weight cobalt.

5. The target according to claim 4 with the following compositions expressed in atomic %:

```
62.5-80% Co
18-30% Ni
0-8% Cr.
```

6. The target as claimed in claim 1, wherein the target is obtained by melting and casting an ingot of the ferromagnetic alloy, quenching in water and subsequently cold-deforming below 400° C., and up to 100% of the hexagonal phase is aligned with the hexagonal prism axes (0001) vertical to the target surface.

7. The target as claimed in claim 1, wherein the target is obtained by melting and casting an ingot of the ferromagnetic alloy, quenching in water and subsequently cold-deforming below 400° C. to a degree of cold deformation of at least 50%.

* * * * *